United States Patent
Cranford, Jr. et al.

(10) Patent No.: US 7,317,777 B2
(45) Date of Patent: Jan. 8, 2008

(54) DIGITAL ADAPTIVE CONTROL LOOP FOR DATA DESERIALIZATION

(75) Inventors: Hayden C Cranford, Jr., Apex, NC (US); Vernon R. Norman, Cary, NC (US); Martin L. Schmatz, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 749 days.

(21) Appl. No.: 10/265,759

(22) Filed: Oct. 7, 2002

(65) Prior Publication Data

US 2004/0066871 A1   Apr. 8, 2004

(51) Int. Cl.
*H04L 25/00* (2006.01)

(52) U.S. Cl. .................................... 375/371

(58) Field of Classification Search ........... 375/371, 375/373, 372, 374, 375, 376, 350, 294
See application file for complete search history.

(56) References Cited

U.S. PATENT DOCUMENTS

| | | | |
|---|---|---|---|
| 3,648,248 A * | 3/1972 | Deman et al. ............. 341/139 |
| 4,146,841 A | 3/1979 | McRae | |
| 4,583,236 A | 4/1986 | Kromer et al. | |
| 5,297,172 A * | 3/1994 | Shenoy et al. ............ 375/371 |
| 5,315,618 A | 5/1994 | Yoshida | |
| 5,425,057 A | 6/1995 | Paff | |
| 5,602,879 A | 2/1997 | Wada | |
| 5,982,821 A * | 11/1999 | Kingston et al. ........... 375/326 |
| 6,034,564 A | 3/2000 | Iwamatsu | |
| 6,137,809 A * | 10/2000 | Martinez et al. ........... 370/503 |
| 6,144,708 A | 11/2000 | Maruyama | |
| 6,215,433 B1 * | 4/2001 | Sonu et al. .................. 341/155 |
| 6,985,549 B1 * | 1/2006 | Biracree et al. ........... 375/355 |
| 7,003,066 B1 * | 2/2006 | Davies et al. .............. 375/376 |
| 7,170,964 B2 * | 1/2007 | Kocaman et al. .......... 375/376 |
| 2002/0146084 A1 * | 10/2002 | Cranford et al. ........... 375/360 |
| 2003/0128789 A1 * | 7/2003 | Drerup et al. .............. 375/371 |

* cited by examiner

*Primary Examiner*—Emmanuel Bayard
(74) *Attorney, Agent, or Firm*—Sawyer Law Group LLP

(57) ABSTRACT

A system and method for tracking/adapting phase or frequency changes in an incoming serial data stream that may contain significant amounts of noise and/or jitter and may contain relatively long periods of successive univalue data bits. The method includes digitally sampling a received data stream at predefined intervals to produce a data set; estimating when logic transitions occur in the data set; detecting a timing trend represented by the estimated logic transitions; and adjusting a frequency of the first clock so that the timing trend averages approximately zero over a plurality of logic transitions.

2 Claims, 4 Drawing Sheets

DIGITAL ADAPTIVE CONTROL LOOP FOR DATA DESERIALIZATION

FIELD OF THE INVENTION

The present invention relates generally to high-speed serial data communications, and more specifically to a digital adaptive control loop for controlling a frequency of a clock in a high-speed serial data receiver to match an embedded frequency in a received serial data stream.

BACKGROUND OF THE INVENTION

Phase-locked loops are well known analog systems for recovering clock timing or clock frequency control. As a data transmission speed of a serial data link between a transmitter in one system or subsystem and a receiver in another system or subsystem increases, data recovery becomes increasingly more difficult. Typically there is a local time reference (e.g., a first clock) used by the transmitter to send the data stream and a separate local time reference (e.g., a second clock) used by the receiver. Accurate data extraction depends upon matching the receiver clock to the transmitting clock, which becomes more difficult as clock speeds increase and the operational power of the transmitter and receiver decreases. Factors that make extraction difficult include clock jitter and noise. Even as clock designs improve to reduce jitter, the increase of the clock speed continues to make jitter a significant factor in data extraction. Further, low power operational modes of the subsystems and supply and/or substrate coupling of multiple analog clock recovery circuits make noise an additional important factor.

For example, a high-speed serial link between two units (e.g., routers) may have a timing difference between local time references on each box be specified as 5000 parts per million which is 0.5 percent with 0.02 percent more common. These values represent a very large amount of jitter or phase/frequency mismatch that may have to be compensated for to accurately extract the serial data. Data extraction is further complicated when the transmitted data has several bit times in succession that have the same value, meaning that the receiver is unable to learn anything about the current clock value in the transmitted data.

Accordingly, what is needed is a system and method for tracking/adapting phase or frequency changes in an incoming serial data stream that may contain significant amounts of noise and/or jitter. The present invention addresses such a need.

SUMMARY OF THE INVENTION

A system and method is disclosed for tracking/adapting phase or frequency changes in an incoming serial data stream that may contain significant amounts of noise and/or jitter and may contain relatively long periods of successive univalue data bits. The method includes a process for adapting a clock control loop, including the steps of: digitally sampling a received data stream at predefined intervals to produce a data set; estimating when logic transitions occur in the data set; detecting a timing trend represented by the estimated logic transitions; and adjusting a frequency of the first clock so that the timing trend averages approximately zero over a plurality of logic transitions. The system includes an adaptive control loop having one or more latches, coupled to a first clock, for digitally sampling a received data stream at predefined intervals to produce a data set; an edge detector, coupled to said one or more latches, for estimating when logic transitions occur in the data set; a digital filter, coupled to the edge detector, for detecting a timing trend represented by the estimated logic transitions; and a frequency adjustor, coupled to the digital filter and to the first clock, for adjusting a frequency of the first clock so that the timing trend averages approximately zero over a plurality of logic transitions.

The present invention efficiently addresses both tracking phase and frequency changes of an incoming serial data stream that may contain significant amounts of noise and clock jitter as well as accounting for significant runs of successive univalue data bits.

DETAILED DESCRIPTION

The present invention relates to tracking/adapting phase or frequency changes in an incoming serial data stream that may contain significant amounts of noise and/or jitter and may contain extended periods of successive univalue data bits. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
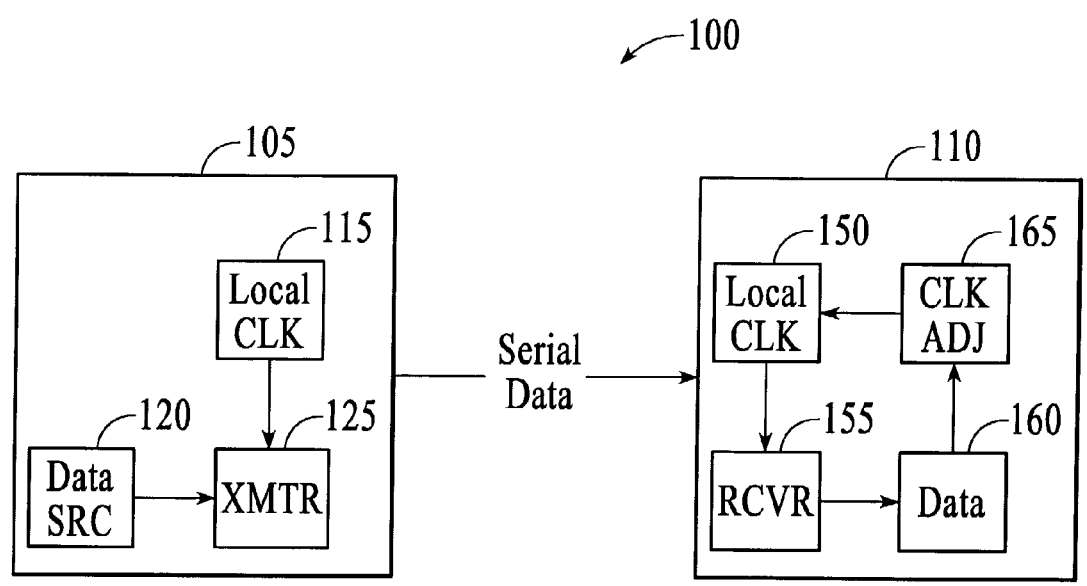
FIG. 1 is a schematic block diagram of a system for sending and receiving serial data.

FIG. 1 is a schematic block diagram of a system 100 for sending and receiving serial data from a transmitting unit 105 to a receiving unit 110. Unit 105 includes a local time reference 115 (e.g., a clock or crystal oscillator), a data source 120 and a transmitter 125. In well-known fashion, transmitter 125 uses the local time reference 115 to serialize and transmit data from data source 120. The transmitted data may contain significant amounts of noise and/or jitter and/or may contain extended periods of successive univalue data bits.

Receiving unit 110 includes a local time reference 150 (e.g., a clock or crystal oscillator), a receiver 155, data extractor 160 and a clock adjustor 165. Receiver 155 and data extractor 160 use an initial frequency value from time reference 150 to receive the transmitted serial data stream and to recover/extract the transmitted clock and data in proper useable format. Extractor 160 provides information regarding the data stream and the recovered data to clock adjustor 165 so that adjustor 165 may change the phase or frequency of time reference 150 to better extract the data. Sampling the data bits in the middle of a bit cell is one goal as it typically provides the best accuracy.

Figure 2:
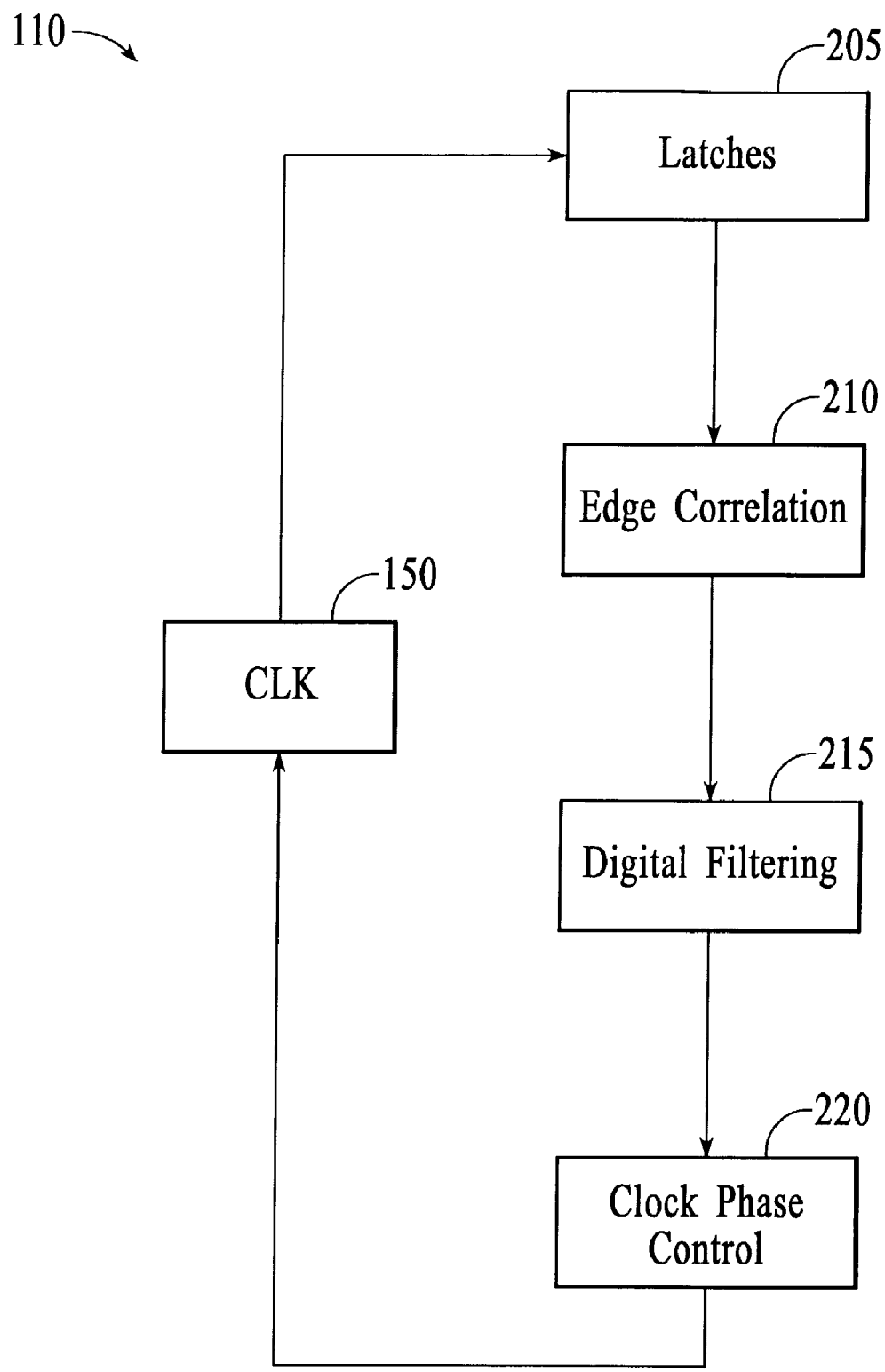
FIG. 2 is a schematic block diagram of a preferred embodiment for an adaptive control loop.

FIG. 2 is a schematic block diagram of a preferred embodiment for receiving unit 110 shown in FIG. 1. Receiving unit 110 includes time reference 150 and one or more latches 205, an edge correlator 210, a digital filter 215, and a phase controller 220. Latches 205, in the preferred embodiment, oversample the data, to take samples of the incoming signal digitally at fixed intervals. Oversampling provides taking more samples than the bits of the data stream, and in the preferred embodiment the sampling is at twice the bit rate.

Edge correlator 210 is a type of edge detection that takes the sampled data from latches 205 (that were taken at different times) and processes the samples so that they align and occur on the same clock. Edge correlator 210 examines the aligned data and determines where the edges are. That is, when the data transitions have occurred in the sampled data stream.

Digital filter 215, in the preferred embodiment is implemented as a state machine, to perform an adaptive low pass filtering function. Filter 215 looks at trends in the movement of the detected edges from one data sample to the next. Filter 215 does not react to high frequency changes in detected edges that are likely to be noise signals. Rather, filter 215 looks for long-term edge movement or trends in the movement of detected or estimated edges. Filter 215 also controls loop gain by providing a variable response to varying degrees of long term movement of the detected edges. In other words, when the edges move very little, filter 125 indicates little adjustment, if any, is necessary. When the edges show a trend with larger movement, filter 125 indicates a larger adjustment is necessary. Filter 215 thus detects long term trends of edge movement ands sets a loop gain of receiver 110 appropriate to remove any trends (e.g., the trends average zero over several bit times).

Filter 215 also has a flywheel function for providing phase controller 220 with trend information in the absence of detected or estimated edges in the received data stream. It is possible to have relatively long periods of successive bits in a data stream with the same logic value, meaning that there are no edges to detect. Filter 215 in the preferred embodiment will continue to issue trend information based upon direction and magnitude of trends passing the filtering function as the flywheel function.

Phase controller 220 is a device for controlling the phase/frequency of time reference 150. In the preferred embodiment, phase controller 220 is a phase rotator. In response to trend information (magnitude and direction) from filter 215, phase controller 150 adjusts time reference 150. The phase rotator of the preferred embodiment, using the trend information, sets time reference 150 to the appropriate phase/frequency to counteract the trend. Phase controller 220 is able to adjust phase either direction and may adjust the phase through three hundred sixty degrees. Note that successively and continuously adjusting a clock phase earlier than previous adjustments results in increasing the frequency.

Figure 3:
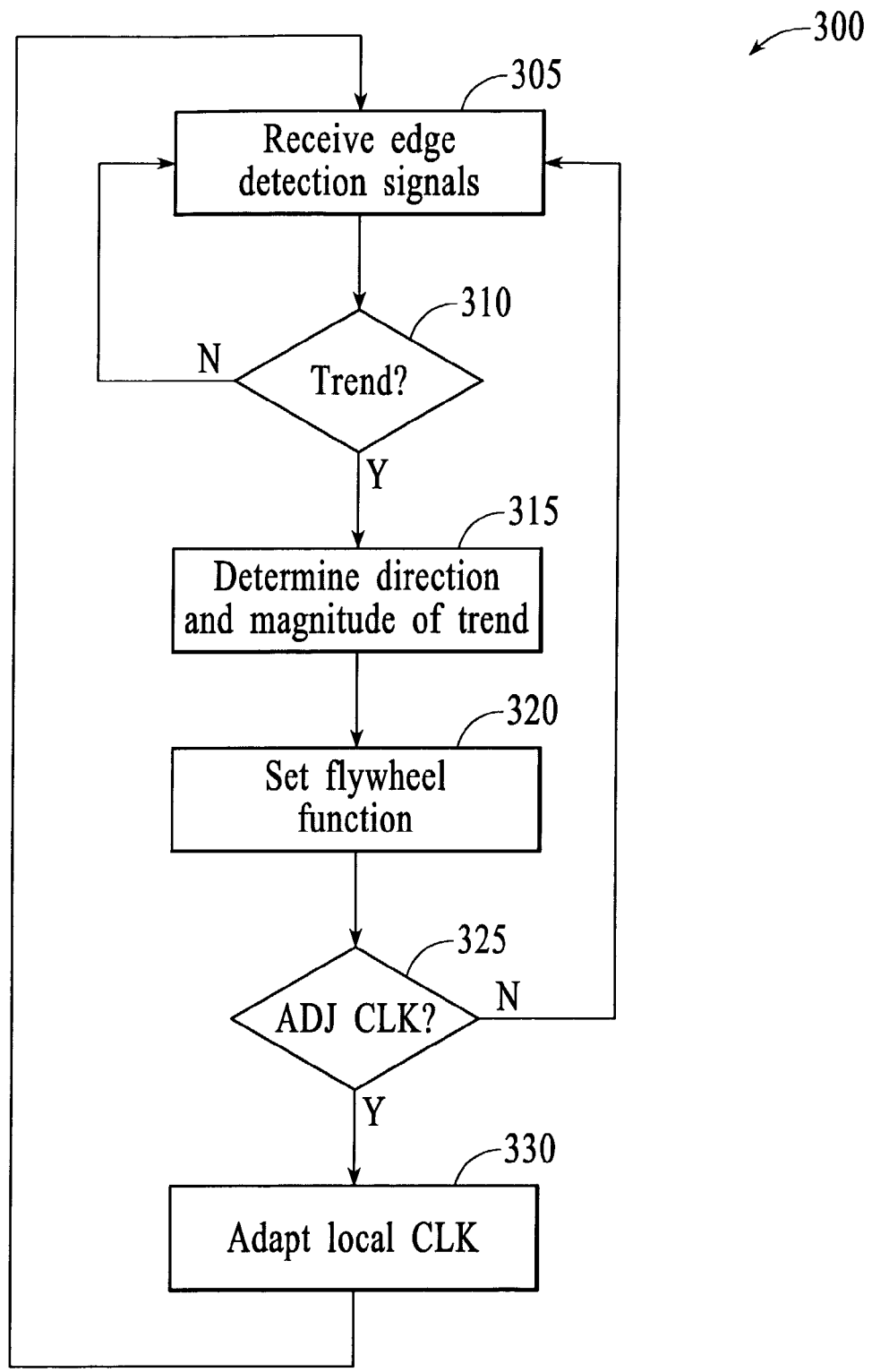
FIG. 3 is a process flow chart of an adaptive control loop.

FIG. 3 is a process flow chart of an adaptive control loop process 300. Process 300, implemented by receiver unit 10 in general, and digital filter 215 specifically, first receives edge detection signals from edge correlator 210 at step 305. Process 300 next tests the edge detection signals at step 310 to determine whether a trend exists. If no trend is detected, process 300 loops back to step 305. However, if a trend is detected, process 300 advances to step 315 to determine the direction and magnitude of the trend. After step 315, process 300 advances to step 320 to set the flywheel function. As discussed above, the flywheel function serves to provide phase controller 220 with phase adjustment information in the absence of detected edges.

After the flywheel function is set in step 320, process 300 advances to step 325 to determine whether time reference 150 should be adjusted. Depending upon the current controls for time reference 150 and the magnitude of the detected trend, step 325 determines whether adjust time reference 150. If no adjustment is necessary, that is there was no detected trend or the magnitude of the trend is less than a preset threshold, then process 300 returns to step 305.

When process 300 determines that it is necessary to adjust time reference 150, process 300 advances to step 330 and issues control signals to the time reference phase/frequency controller. After issuing timing adjustment control signals, process 300 returns to step 305.

Figure 4:
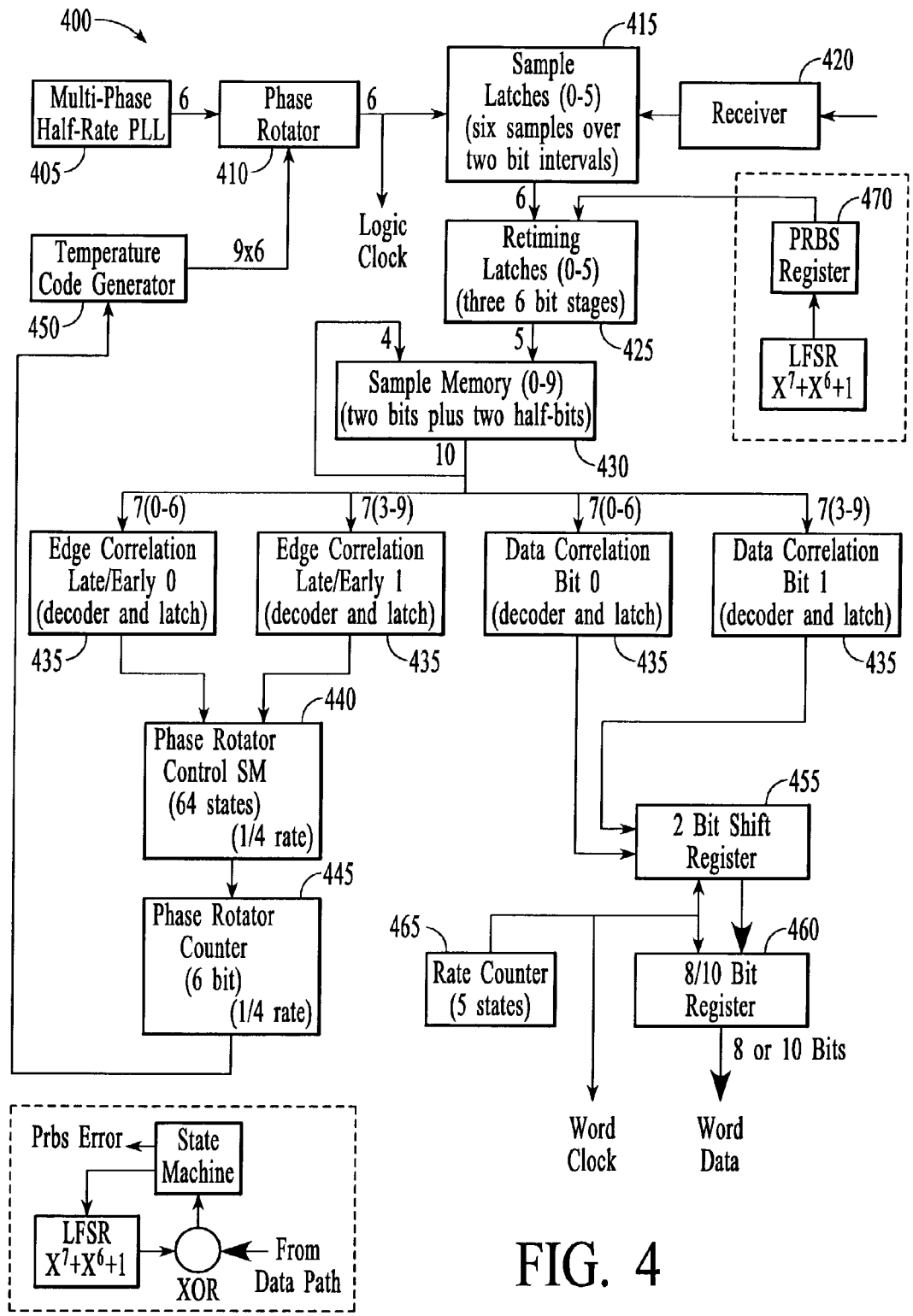
FIG. 4 is a detailed block diagram of a circuit implementing an adaptive control loop.

FIG. 4 is a detailed block diagram of a receiver unit 400 implementing an adaptive control loop of the preferred embodiment. A phase-locked loop (PLL) 405 is controlling a three-stage ring oscillator running at half the bit frequency. Four receivers share this PLL 405, PLL is implemented as a voltage-controlled oscillator (VCO). There are six output phases from the voltage-controlled oscillator that are fed into a phase rotator 410 having 54 steps for a 2p interval. The 54 steps are generated with a finite impulse response (FIR) phase rotator 410 having 6 phases with 3 inter-slice phase steps that are further divided by three.

The six outputs of phase rotator 410 are buffered, and the edges are shaped to be able to sample a signal having twice the frequency using one or more latches 415. One of the phase outputs is used as a local recovered clock (not shown). A clock buffer makes sure that it is not loading phase rotator 410 too much. Timing analysis determines which phase is the optimum to use. An output section of phase rotator 410 suppresses common mode signals and performs a limiting signal.

The output is then driven out to phase buffers (with the signals from phase rotator 410) that in turn provide clocks. Six samples are taken over a two-bit interval using latches 415 from serial data received from receiver 420. A block of latches 425 adds three pipeline stages in order to reduce the probability of a metastable state to a value much lower than the targeted bit error rate. It also helps to align the data to one single clock phase. In order to be able to process information from more than one bit interval for the recovery of one data bit, a memory stage 430 re-uses four samples from the previous sampling period. A total of 10 samples is therefore fed into the half rate edge and data correlation blocks 435 that make use of a pattern recognition algorithm. Truth tables are used to represent an initial best guess for the data. The outputs of the edge and data detection block are the recovered two bit and the early and late signals going to a phase rotator control state machine 440. A bang-bang control circuit with adaptive step size is used in state machine 440. A rotator counter 445 and a thermometer code generator 450 generates the 54 control signals for phase rotator 410 and this closes the CDR loop. The data path consists of a shift register 455 that loads two bits from data correlation blocks 435 during each half-rate cycle. Shift register 455 is loaded to a word data register 460 (8 or 10 bits) using a word clock 465 derived from PLL clock 405.

Receiver 400 also contains a Pseudo-Random Bit Stream (PRBS) generator 470 and checker which allows for self-testing in a wrap mode as well as link testing with a corresponding transmitter.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An adaptive control loop, comprising:

one or more latches, coupled to a first clock, for digitally sampling a received data stream at predefined intervals to produce a data set;

an edge detector, coupled to said one or more latches, for estimating when logic transitions occur in the data set;

a digital filter, coupled to the edge detector, for detecting a timing trend represented by the estimated logic transitions, wherein the timing trend is based on movement of the estimated logic transitions, wherein the digital filter is a state machine, wherein the digital filter includes a digital flywheel for providing timing trend data to a frequency adjustor in the absence of binary logic transitions over an extended period, wherein the digital filter controls loop gain by providing a variable response to varying degrees of long-term movement of detected edges, wherein if a trend is detected, the digital filter determines the direction and magnitude of the trend, wherein if an edge moves very little, the digital filter indicates little adjustment, and wherein an edge moves shows a trend with a larger movement, the digital filter indicates a larger adjustment, wherein when the digital filter detects long-term trends of edge movement, the digital filter sets a loop gain to remove any trends, and wherein the digital filter does not react to high-frequency changes in detected edges that are likely to be noise signals; and wherein the frequency adjustor is coupled to the digital filter and to the first clock, for adjusting a frequency of the first clock so that the timing trend averages approximately zero over a plurality of logic transitions, wherein the frequency adjustor variably adjusts the frequency of the first clock at increasingly larger increments in response to increasingly larger magnitudes of the detected timing trend, wherein the frequency of the first clock approximates a frequency of a second clock, and wherein adjustment of the first clock enables deserialization of a received serial data stream transmitted using the second clock.

2. A method for adapting a clock control loop, comprising the steps of:

digitally sampling a received data stream at predefined intervals to produce a data set;

estimating when logic transitions occur in the data set;

utilizing a digital filter for detecting a timing trend represented by the estimated logic transitions, wherein the timing trend is based on movement of the estimated logic transitions, wherein the digital filter is a state machine, wherein the digital filter includes a digital flywheel for providing timing trend data to a frequency adjustor in the absence of binary logic transitions over an extended period, wherein the digital filter controls loop gain by providing a variable response to varying degrees of long-term movement of detected edges, wherein if a trend is detected, the digital filter determines the direction and magnitude of the trend, wherein if an edge moves very little, the digital filter indicates little adjustment, and wherein an edge moves shows a trend with a larger movement, the digital filter indicates a larger adjustment, wherein when the digital filter detects long-term trends of edge movement, the digital filter sets a loop gain to remove any trends, and wherein the digital filter does not react to high-frequency changes in detected edges that are likely to be noise signals; and utilizing the frequency adjustor for adjusting a frequency of the first clock so that the timing trend averages approximately zero over a plurality of logic transitions, wherein the frequency adjustor variably adjusts the frequency of the first clock at increasingly larger increments in response to increasingly larger magnitudes of the detected timing trend, wherein the frequency of the first clock approximates a frequency of a second clock, and wherein adjustment of the first clock enables deserialization of a received serial data stream transmitted using the second clock.

* * * * *